United States Patent
Ai et al.

(10) Patent No.: US 9,659,989 B1
(45) Date of Patent: May 23, 2017

(54) IMAGE SENSOR WITH SEMICONDUCTOR TRENCH ISOLATION

(71) Applicant: OMNIVISION TECHNOLOGIES, INC., Santa Clara, CA (US)

(72) Inventors: Chun-Yung Ai, Taipei (TW); Chia-Ying Liu, Hsinchu (TW); Wu-Zang Yang, Shi-Hu Town (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/133,043

(22) Filed: Apr. 19, 2016

(51) Int. Cl.
*H01L 27/146* (2006.01)
*H01L 21/762* (2006.01)

(52) U.S. Cl.
CPC .... *H01L 27/1463* (2013.01); *H01L 21/76237* (2013.01); *H01L 27/14645* (2013.01); *H01L 27/14689* (2013.01)

(58) Field of Classification Search
CPC .......... H01L 27/1463; H01L 21/76237; H01L 29/7846
See application file for complete search history.

(56) References Cited

U.S. PATENT DOCUMENTS

| | | | |
|---|---|---|---|
| 2006/0081890 A1* | 4/2006 | Kang | H01L 27/14623 257/233 |
| 2008/0035963 A1* | 2/2008 | Kwon | H01L 27/14603 257/291 |
| 2011/0031578 A1* | 2/2011 | Miura | H01L 21/02381 257/462 |
| 2011/0140220 A1 | 6/2011 | Marty et al. | |
| 2013/0032912 A1* | 2/2013 | Chen | H01L 27/1463 257/431 |
| 2013/0234202 A1* | 9/2013 | JangJian | H01L 27/1464 257/184 |
| 2015/0035102 A1* | 2/2015 | Ashidate | H01L 27/1463 257/432 |
| 2015/0243694 A1* | 8/2015 | Ihara | H01L 27/14605 257/443 |
| 2015/0279878 A1* | 10/2015 | Ahmed | H01L 27/1463 257/446 |
| 2015/0372034 A1* | 12/2015 | Chen | H01L 27/14614 257/292 |
| 2015/0380447 A1* | 12/2015 | Chou | H01L 27/1463 257/437 |
| 2016/0043120 A1* | 2/2016 | Ahn | H01L 27/1463 257/229 |
| 2016/0204142 A1* | 7/2016 | Um | H01L 27/1463 257/446 |

* cited by examiner

*Primary Examiner* — Daniel Luke
(74) *Attorney, Agent, or Firm* — Blakeley Sokoloff Taylor & Zafman LLP

(57) ABSTRACT

An image sensor pixel includes a photodiode disposed in a semiconductor material, and doped regions surrounding the photodiode, at least in part. The doped regions include a doped portion of the semiconductor material. Deep trench isolation structures are disposed in the doped regions, and surround the photodiode at least in part. The deep trench isolation structures include a SiGe layer disposed on side walls of the deep trench isolation structures, a high-k dielectric disposed on the SiGe layer, and a filler material.

20 Claims, 4 Drawing Sheets

DOPE SEMICONDUCTOR MATERIAL AND ETCH TRENCHES

DEPOSIT P+ SiGe

DEPOSIT HIGH-K DIELECTRIC

DEPOSIT FILLER MATERIAL

IMAGE SENSOR WITH SEMICONDUCTOR TRENCH ISOLATION

TECHNICAL FIELD

This disclosure relates generally to semiconductor fabrication, and in particular but not exclusively, relates to image sensor pixel isolation.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

Pixel crosstalk currently limits performance of semiconductor image sensor devices. Ideally each pixel in an image sensor operates as an independent photon detector. In other words, electron/hole content in one pixel does not spill into neighboring pixels (or any other pixels in the device). In real image sensors, this is not the case. Electrical signals may move from one pixel to another. This crosstalk may increase the number of white pixels, reduce image sensor sensitivity, and cause color-signal mixing. Unfortunately, many solutions to crosstalk often exaggerate the effects of dark current or contribute to it. The combination of dark current and crosstalk may lead to appreciable image degradation.

Many techniques have been employed to mitigate the effects of crosstalk/dark current and enhance image sensor performance. However, some of these methods may not entirely eliminate the effects of pixel crosstalk and dark current.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
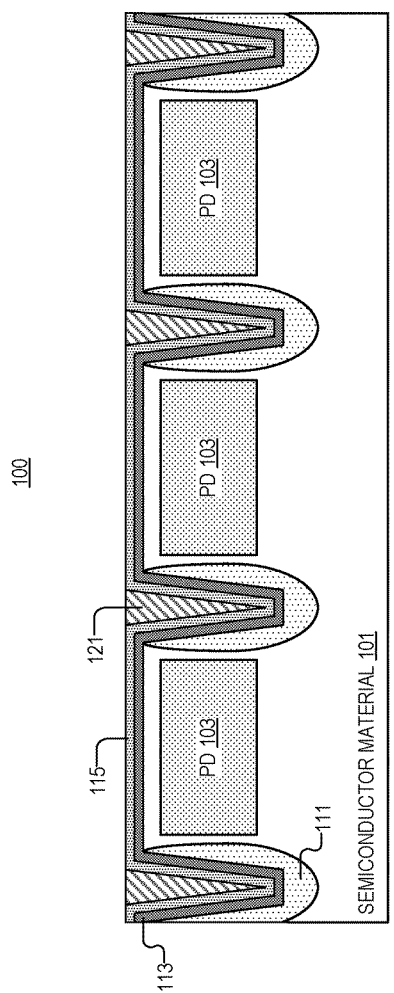
FIG. 1 is a cross sectional illustration of an example image sensor, in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for an image sensor with semiconductor trench isolation are described herein. In the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1 is a cross sectional illustration of an example image sensor 100. Image sensor 100 includes: semiconductor material 101, plurality of photodiodes 103, doped regions 111, and deep trench isolation structures. Deep trench isolation structures include: narrow bandgap semiconductor material 113 (e.g., P+ SiGe), high-k dielectric 115, and filler material 121. It is worth noting that some skilled in the art may refer to "deep trench isolation structures" as including doped regions 111; however, here doped regions 111 are referred to as their own distinct structure for the sake of clearly describing device architecture.

As shown, plurality of photodiodes 103 are disposed in semiconductor material 101, and doped regions 111 are also disposed in semiconductor material 101. Doped regions 111 surround individual photodiodes 103, at least in part. In the depicted example, doped regions 111 include a doped portion of semiconductor material 101, which may have been formed via ion implantation or the like. Deep trench isolation structures are disposed in doped regions 111 and surrounding individual photodiodes 103, at least in part. In one example, deep trench isolation structures are disposed a distance from the lateral edges of photodiodes 103. Narrow bandgap semiconductor material 113 is disposed on side walls of the deep trench isolation structures, and high-k dielectric 115 is disposed on the narrow bandgap semiconductor material 113. Filler material 121 may be disposed in the deep trench isolation structures. Narrow bandgap semiconductor material 113 is disposed between doped regions 111, and high-k dielectric 115. High-k dielectric 115 is disposed between narrow bandgap semiconductor material 113 and the filler material 121. Narrow bandgap semiconductor material 113 has a narrower bandgap than semiconductor material 101. In one example, filler material 121 includes a metal or an oxide.

Since the illustrated example depicts a cross-sectional view of image sensor 100, it should be noted that the deep trench isolation structures (and doped regions 111) may encircle photodiodes 103. In some examples, the deep trench isolation structures are arranged into a grid pattern that surrounds individual photodiodes 103, to prevent charge from spilling between photodiodes 103. In the depicted example, the location of doped regions 111 may be the same as deep trench isolation structures. Doped regions 111 may take the oval-like shape depicted, or may be substantially rectangular, trapezoidal, or the like, depending on implantation techniques employed.

In the illustrated example, the narrow bandgap semiconductor material 113 includes SiGe with P-type dopant; doped regions 111 include P-type dopant; and plurality of photodiodes 103 include a majority of N-type dopant. Further, high-k dielectric 115 is electrically coupled to the SiGe layer to induce positive charge accumulation at an interface between the SiGe layer and semiconductor material 101. In one example, positive charge accumulation is the product of high-k dielectric 115 having an inherent negative surface charge, as is the case with hafnium oxide. Use of both doped regions 111, and narrow bandgap semiconductor material 113/high-k dielectric 115 works to induce a high quantity of positive charge buildup between individual photodiodes 103 in the plurality of photodiodes 103. Positive charge at the interface of narrow bandgap semiconductor material 113 and semiconductor material 101 may help to reduce crosstalk between photodiodes 103, because the interface voltage blocks charge transport between surface states in semiconductor material 101. Thus, charge from semiconductor material 101 surface states is prevented from moving between pixels on the backside of image sensor 100. This mitigates undesirable electrical effects such as dark current and white pixels, both of which degrade image quality.

As previously discussed, high-k dielectric 115 may include hafnium oxide ($HfO_2$ or $HfO_x$); however, in other examples, high-k dielectric 115 may include other oxides such as: silicon oxide ($SiO_2$), silicon nitride ($Si_3N_4$), silicon oxynitirde ($SiO_xN_y$), tantalum oxide ($Ta_2O_5$), titanium oxide ($TiO_2$), zirconium oxide ($ZrO_2$), aluminum oxide ($Al_2O_3$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), or the like. Additionally, one skilled in the relevant art, will recognize that any stoichiometric combination of the above metals/semiconductors and their oxides/nitrides/oxynitrides may be employed in high-k dielectric 115, in accordance with the teachings of the present invention.

Similarly, although narrow bandgap semiconductor material 113 may include SiGe, other narrow bandgap semiconductor materials may be employed including: GaAs, Pbs, PbSe, PbTe, GaSb, InN, etc. Furthermore, any group 3 elements (B, Al, Ga, In, Tl), group 4 elements (C, Si, Ge, Sn, Pb), group 5 elements (N, P, As, Sb, Bi), or the like, may be used to form a suitable narrow bandgap semiconductor, in accordance with the teachings of the present invention.

Figure 2:
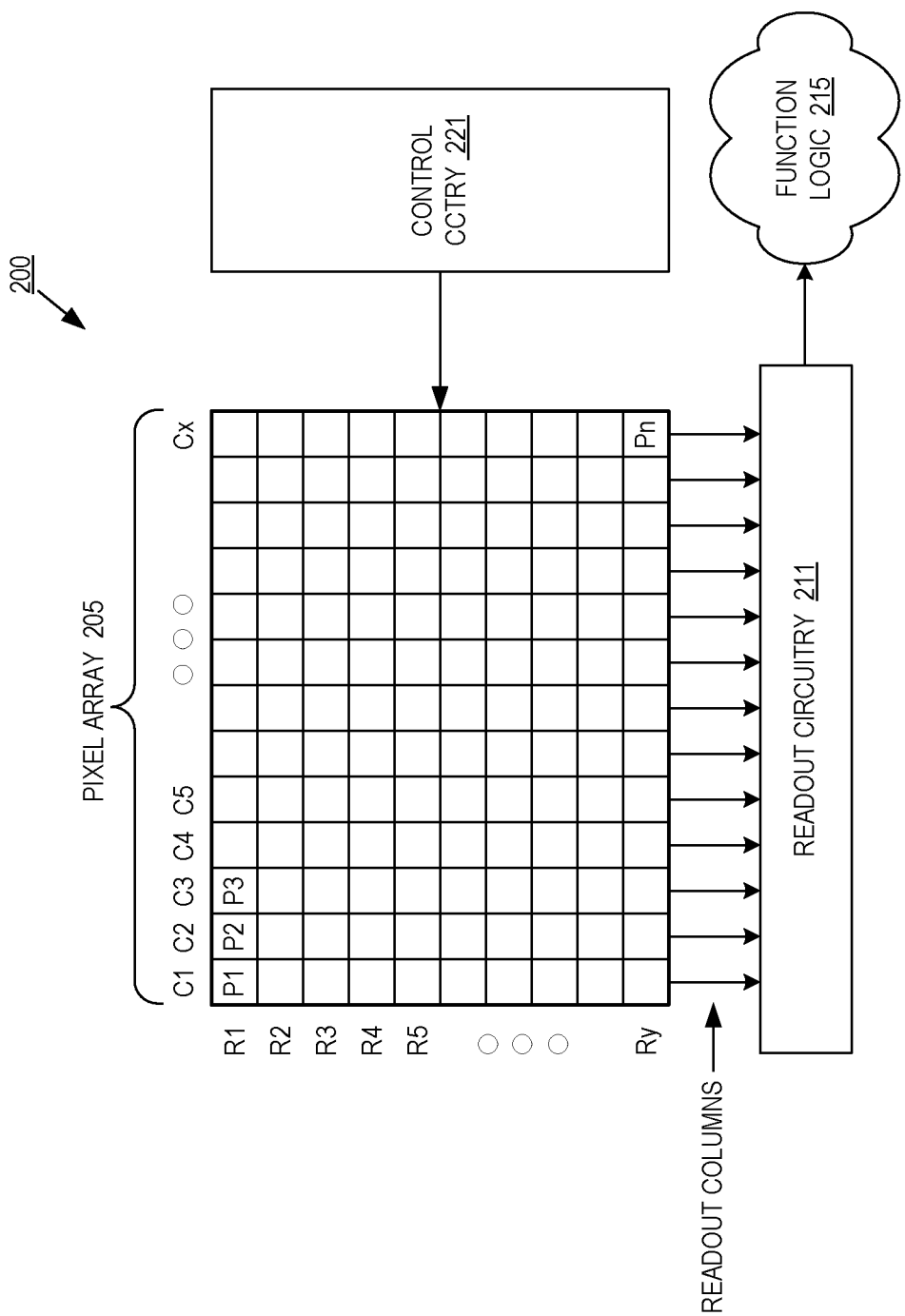
FIG. 2 is a block diagram illustrating one example of an imaging system including the image sensor of FIG. 1, in accordance with the teachings of the present invention.

FIG. 2 illustrates one example of an imaging system 200 including the image sensor of FIG. 1 (i.e., image sensor 100). Imaging system 200 includes pixel array 205, control circuitry 221, readout circuitry 211, and function logic 215. In one example, pixel array 205 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 205 has acquired its image data or image charge, the image data is readout by readout circuitry 211 and then transferred to function logic 215. Readout circuitry 211 may be coupled to readout image data from the plurality of photodiodes in pixel array 205. In various examples, readout circuitry 211 may include amplification circuitry, analog-to-digital (ADC) conversion circuitry, or otherwise. Function logic 215 may simply store the image data or even manipulate the image data by applying post image effects (e.g., crop, rotate, remove red eye, adjust brightness, adjust contrast, or otherwise). In one example, readout circuitry 211 may readout a row of image data at a time along readout column lines (illustrated) or may readout the image data using a variety of other techniques (not illustrated), such as a serial readout or a full parallel readout of all pixels simultaneously.

In one example, control circuitry 221 is coupled to pixel array 205 to control operation of the plurality of photodiodes in pixel array 205. For example, control circuitry 221 may generate a shutter signal for controlling image acquisition. In one example, the shutter signal is a global shutter signal for simultaneously enabling all pixels within pixel array 205 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 200 may be included in a digital camera, cell phone, laptop computer, or the like. Additionally, imaging system 200 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 200, extract image data from imaging system 200, or manipulate image data supplied by imaging system 200.

FIGS. 3A-3D show an example method 300 for forming the image sensor of FIG. 1. The order in which some or all illustrations appear in method 300 should not be deemed limiting. Rather, one of ordinary skill in the art having the benefit of the present disclosure will understand that some of method 300 may be executed in a variety of orders not illustrated, or even in parallel. Furthermore, method 300 may omit certain illustrations in order to avoid obscuring certain aspects. Alternatively, method 300 may include additional illustrations that may not be necessary in some embodiments/examples of the disclosure.

Figure 3A:
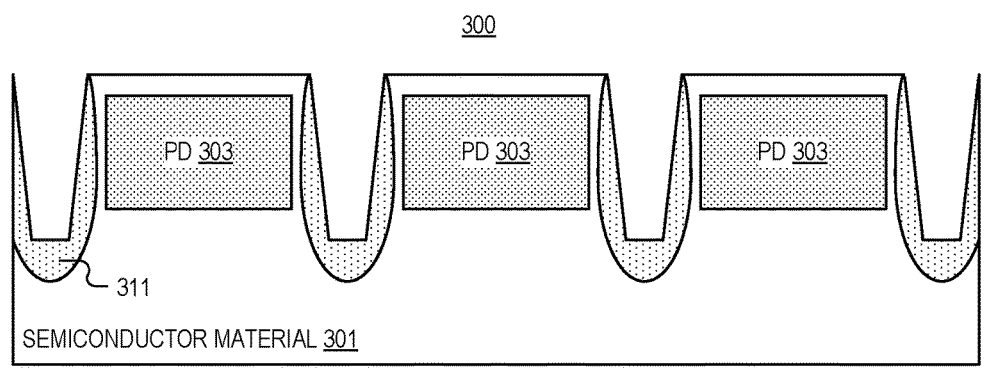
FIGS. 3A-3D show an example process for forming the image sensor of FIG. 1, in accordance with the teachings of the present invention.

FIG. 3A shows providing semiconductor material 301 (including plurality of photodiodes 303 disposed in the semiconductor material 301), and etching trenches in the semiconductor material 301. Etching of trenches may be achieved by depositing a photoresist (positive or negative) pattern on the surface of semiconductor material 301, and using an etchant to remove portions of semiconductor material 301. The etchant used may be wet or dry depending on the desired etch rate and feature geometries. Trenches may be disposed between individual photodiodes 303 in the plurality of photodiodes 303 and surround, at least in part, the individual photodiodes 303.

In the depicted example, doped regions 311 have already been formed between individual photodiodes 303, and doped regions 311 include semiconductor material 301 with P-type dopant. However, in other examples, doped regions 311 may be formed later in the fabrication process—for example, after trenches are etched into semiconductor material 301. Doped regions 311 and photodiodes 303 may be fabricated via one or more ion implantation processes, or may be grown through a CVD process or the like. As shown, doped regions 311 are disposed a lateral distance from the edges of individual photodiodes 303 and surround individual photodiodes 303, at least in part. However, in other examples, doped regions 311 may completely surround the individual photodiodes 303.

Figure 3B:
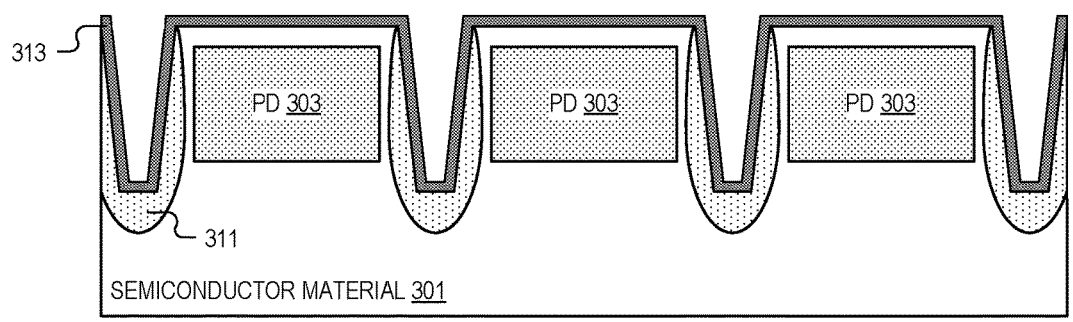

FIG. 3B illustrates depositing narrow bandgap semiconductor material 313 on walls of the trenches. Narrow bandgap semiconductor material 313 has a narrower bandgap than semiconductor material 301. As shown, in some examples, narrow bandgap semiconductor material 313 may also be deposited on the upper surface of semiconductor material 301, between individual photodiodes 303. However, in other examples, narrow bandgap semiconductor material 313 may be removed from the upper surface of semiconductor material 301 prior to forming other layers of device architecture. Deposition of narrow bandgap semiconductor material 313 may be achieved via chemical vapor deposition, atomic layer deposition, molecular beam epitaxy, or the like, at temperatures below 450° C. This prevents damage to previously fabricated pieces of device architecture (such as photodiodes 303) by limiting thermal diffusion of dopant atoms. As stated, narrow bandgap semiconductor material 313 may include SiGe, because high quality SiGe films may be grown at low temperatures such as these.

Figure 3C:
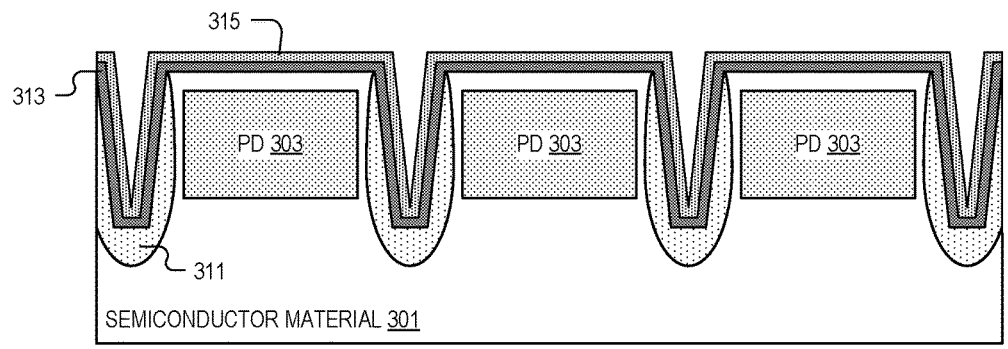

FIG. 3C depicts depositing high-k dielectric 315 in the trenches, such that narrow bandgap semiconductor material 313 is disposed between semiconductor material 301 and high-k dielectric 315. As shown, in some examples, high-k dielectric 315 may also be deposited on the upper surface of the semiconductor material 301 on top of narrow bandgap semiconductor material 313. However, in other examples, high-k dielectric 315 may be removed from the upper surface of semiconductor material 301 prior to forming other layers of device architecture. High-k dielectric 315 is coupled to narrow bandgap semiconductor material 313 to induce positive charge accumulation at the interface between semiconductor material 301 and narrow bandgap semiconductor material 313. More specifically, high-k dielectric 315 is coupled to narrow bandgap semiconductor material 313 to induce positive charge accumulation at the interface between narrow bandgap semiconductor material 313 and doped region 311. This positive charge accumulation may be achieved by selecting a dielectric material with a negative surface charge or by applying an external voltage. Deposition of high-k dielectric 315 may be completed through chemical vapor deposition, atomic layer deposition, molecular beam epitaxy, or the like.

Figure 3D:
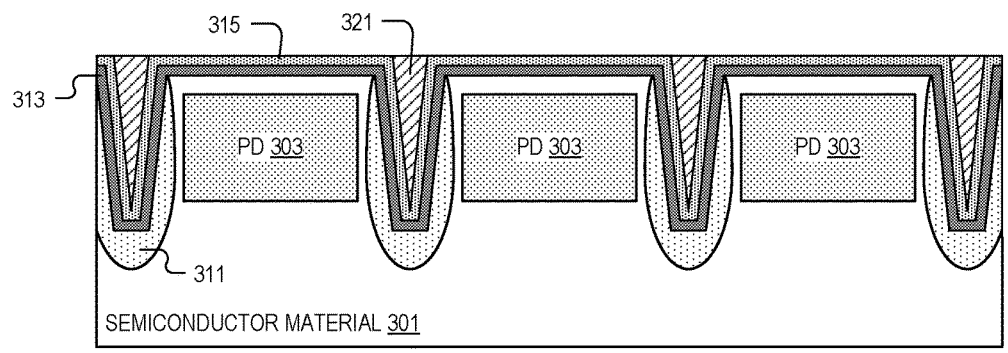

FIG. 3D illustrates depositing filler material 321 in the trenches. High-k dielectric 315 is disposed between narrow bandgap semiconductor material 313 and filler material 321. In some examples, filler material 321 includes a metal (such as tungsten, copper, aluminum, or the like) or an oxide (such as those listed in the discussion of high-k dielectric 115). In one example, filler material 321 may be the same material as high-k dielectric 315.

Although not depicted, a metal grid may be formed above the plurality of photodiodes 303, and a color filter array may be deposited in the metal grid. In one example, the color filter array includes red, green, and blue color filters which may be arranged into a Bayer pattern, EXR pattern, X-trans pattern, or the like. However, in a different or the same example, the color filter array may include infrared filters, ultraviolet filters, or other light filters that isolate invisible portions of the EM spectrum. Furthermore, microlenses may be formed on the color filter array. Microlens may be fabricated from a photo-active polymer that is patterned on the surface of the color filter array. Once rectangular blocks of polymer are patterned on the color filter array, the blocks may be melted (or reflowed) to form the dome-like structure characteristic of microlenses.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
   a photodiode disposed in a semiconductor material;
   doped regions disposed in the semiconductor material and surrounding the photodiode at least in part, wherein the doped regions include a doped portion of the semiconductor material; and
   deep trench isolation (DTI) structures surrounding the photodiode at least in part, wherein the DTI structures are disposed within the doped regions and include:
      a SiGe layer disposed on side walls of the DTI structures;
      a high-k dielectric disposed on the SiGe layer, wherein the SiGe layer is disposed between the doped regions and the high-k dielectric; and
      a filler material, wherein the high-k dielectric is disposed between the SiGe layer and the filler material,
   wherein a portion of the SiGe layer and the high-k dielectric extends laterally along a planar region of the semiconductor material from one of the side walls of a first DTI structure, included in the DTI structures, towards the photodiode, and wherein the portion of the SiGe layer and the high-k dielectric is optically aligned with the photodiode.

2. The image sensor pixel of claim 1, wherein the high-k dielectric is electrically coupled to the SiGe layer to induce positive charge accumulation at an interface between the SiGe layer and the semiconductor material.

3. The image sensor pixel of claim 1, wherein the SiGe layer includes P-type dopant, the doped regions include P-type dopant, and the photodiode includes N-type dopant.

4. The image sensor pixel of claim 1, wherein the filler material includes a metal or an oxide.

5. The image sensor pixel of claim 1, wherein the doped regions and the DTI structures encircle the photodiode and are disposed a distance from lateral edges of the photodiode.

6. An imaging system, comprising:
   a plurality of photodiodes, including a first photodiode, disposed in a semiconductor material; and deep trench isolation (DTI) structures, including a first DTI structure, disposed in the semiconductor material, including:
  a narrow bandgap semiconductor material disposed in the (DTI) structures, wherein the narrow bandgap semiconductor material has a narrower bandgap than the semiconductor material;
  a filler material disposed in the (DTI) structures; and
  a high-k dielectric disposed between the narrow bandgap semiconductor material and the filler material, wherein the high-k dielectric is electrically coupled to the narrow bandgap semiconductor material to induce positive charge accumulation at an interface between the semiconductor material and the narrow bandgap semiconductor material, wherein a portion of the narrow bandgap semiconductor material and the high-k dielectric extends laterally along a planar region of the semiconductor material from within the first DTI structure towards the first photodiode, wherein the portion is optically aligned with the first photodiode, and wherein the portion is coupled between the first DTI structure and an adjacent second DTI structure included in the DTI structures.

7. The imaging system of claim 6, further comprising doped regions disposed between individual photodiodes in the plurality of photodiodes, wherein the doped regions include doped semiconductor material, and wherein the DTI structures are disposed in the doped regions so the narrow bandgap semiconductor material is in contact with the doped regions.

8. The imaging system of claim 7, wherein the doped regions include P-type dopant, and the plurality of photodiodes include N-type dopant.

9. The imaging system of claim 6, wherein the DTI structures surround, at least in part, individual photodiodes in the plurality of photodiodes.

10. The imaging system of claim 6, further comprising control circuitry and readout circuitry coupled to the plurality of photodiodes, wherein the control circuitry controls operation of the plurality of photodiodes, and the readout circuitry reads out image data from the plurality of photodiodes.

11. The imaging system of claim 6, wherein the high-k dielectric includes a dielectric material with a negative surface charge.

12. The imaging system of claim 6, wherein the narrow bandgap semiconductor material includes P-doped SiGe.

13. The imaging system of claim 6, wherein the filler material includes a metal or an oxide.

14. A method of image sensor fabrication, comprising:
  providing a semiconductor material having a first side and a second side opposite the first side, the semiconductor material including a plurality of photodiodes disposed in the semiconductor material proximate to the first side;
  etching trenches, from the first side into the semiconductor material, disposed between individual photodiodes in the plurality of photodiodes and surrounding, at least in part, the individual photodiodes;
  depositing a continuous layer of a narrow bandgap semiconductor material on the first side of the semiconductor material and the walls of the trenches, wherein the narrow bandgap semiconductor material has a narrower bandgap than the semiconductor material; and
  depositing a high-k dielectric, wherein the narrow bandgap semiconductor material is disposed between the semiconductor material and the high-k dielectric, wherein the high-k dielectric is coupled to the narrow bandgap semiconductor material to induce positive charge accumulation at an interface between the semiconductor material and the narrow bandgap semiconductor material, and wherein a portion of the continuous layer and the high-k dielectric extends laterally along a planar region of the semiconductor material from within a first trench, included in the trenches, towards a first photodiode included in the plurality of photodiodes, and wherein the portion is optically aligned with the first photodiode.

15. The method of claim 14, wherein the narrow bandgap semiconductor material includes SiGe.

16. The method of claim 14, further comprising forming doped regions disposed between the individual photodiodes, wherein the doped regions include the semiconductor material with P-type dopant, and wherein the trenches are disposed in the doped regions.

17. The method of claim 16, wherein the doped regions are disposed a lateral distance from edges of the individual photodiodes and surround the individual photodiodes, at least in part.

18. The method of claim 14, further comprising depositing filler material in the trenches, wherein the high-k dielectric is disposed between the narrow bandgap semiconductor material and the filler material, and wherein the filler material includes a metal or an oxide.

19. The method of claim 14, wherein the narrow bandgap semiconductor material is deposited at a temperature less than 450° C.

20. The method of claim 14, wherein the high-k dielectric includes a dielectric material with a negative surface charge.

* * * * *